(12) United States Patent
Alexander

(10) Patent No.: US 6,466,006 B2
(45) Date of Patent: *Oct. 15, 2002

(54) GRAPHICAL SYSTEM AND METHOD FOR AUTOMATICALLY SCALING WAVEFORMS IN A SIGNAL MEASUREMENT SYSTEM

(75) Inventor: Jay A Alexander, Monument, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/742,496

(22) Filed: Dec. 19, 2000

(65) Prior Publication Data

US 2001/0001137 A1 May 10, 2001

Related U.S. Application Data

(63) Continuation of application No. 09/231,048, filed on Jan. 14, 1999, which is a continuation of application No. 08/863,995, filed on May 27, 1997, now Pat. No. 5,939,877.

(51) Int. Cl.[7] ............................. G01R 13/20; G09G 5/36
(52) U.S. Cl. ..................................... 324/121 R; 706/66
(58) Field of Search ................. 702/66, 67; 324/121 R, 324/76.11, 76.12; 345/441, 619, 643, 660, 661

(56) References Cited

U.S. PATENT DOCUMENTS 5,939,877 A * 8/1999 Alexander .............. 324/121 R
6,229,536 B1 * 5/2001 Alexander et al. .......... 345/340

* cited by examiner

Primary Examiner—Walter E. Snow

(57) ABSTRACT

A signal scaling system and methodology for use in a signal measurement system such as a digital or analog oscilloscope, logic analyzer, network analyzer, spectrum analyzer or waveform generator that has a graphical user interface which controls a waveform display region on a display device. The signal scaling system determines one or more displayed waveform scaling parameters to cause portions of selected displayed waveforms appearing within a rescaling rectangle to occupy a predetermined portion of the waveform display region other than the rescaling rectangle. For each of the selected displayed waveforms, the scaling parameters may include horizontal scaling, horizontal offset, vertical scaling and vertical offset. Preferably, the predetermined portion of the waveform display region comprises the entire waveform display region and the selected displayed waveforms include all waveforms at least partially within the rescaling rectangle. The displayed waveforms may include signal waveforms, function waveforms, and memory waveforms and the signal measurement system is preferably a digital oscilloscope. The signal scaling system includes an rescaling rectangle specification unit for outlining an rescaling rectangle on the waveform display region between user-specified start and end points. A scaling computation unit calculates the displayed waveform scaling parameters based upon specifications of the rescaling rectangle generated by the rescaling rectangle specification unit and current scaling parameters generated by the signal measurement system.

20 Claims, 8 Drawing Sheets

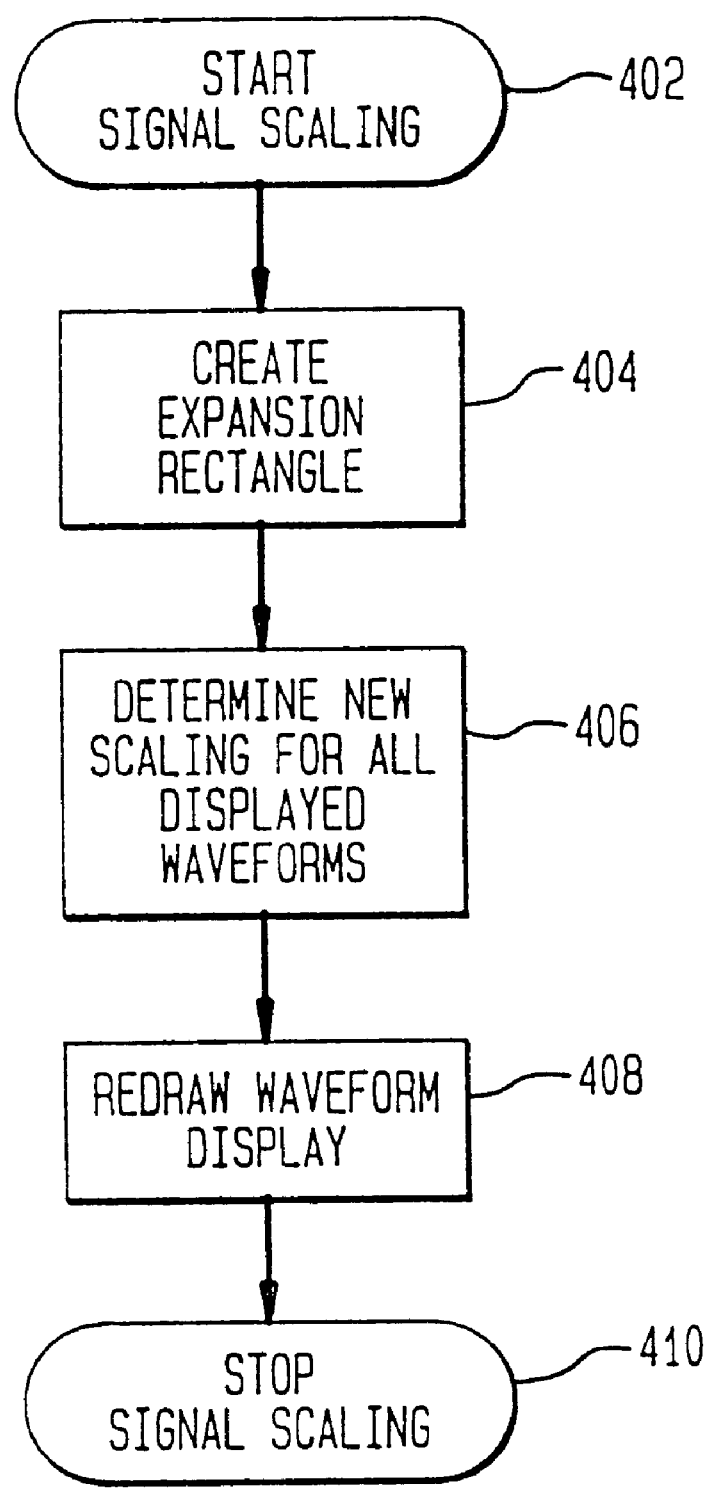

GRAPHICAL SYSTEM AND METHOD FOR AUTOMATICALLY SCALING WAVEFORMS IN A SIGNAL MEASUREMENT SYSTEM

CROSS REFERENCE TO RELATED APPLICATIONS

This application is a continuation of application Ser. No 09/231,048, filed Jan. 14, 1999, now pending, which is a continuation of application Ser. No. 08/863,995, filed May 27, 1997, now issued as U.S. Pat. No. 5,939,877.

BACKGROUND OF THE INVENTION

1. Field of the Invention

The present invention relates generally to signal measurement systems and, more particularly, to scaling displayed waveforms in signal measurement systems.

2. Related Art

Conventional signal measurement systems such[ ]as digital oscilloscopes sample, record and display time-varying analog signals. Samples of an input signal are taken and quantized, and the resultant digital representations are stored in a waveform memory under the control of a sampling clock. The acquired data may subsequently be read out as locations in memory are sequentially addressed by a clock signal to provide digital data which can be converted to a time-varying output signal for a waveform display. The sampling clock may be operated at one of several selectable rates depending upon the frequency content of the input signal. The selection of the portion of the analog input signal which is sampled and stored is determined by appropriate triggering circuitry to enable the operator to display the desired portion of the waveform.

There are many types of display elements which can be presented in signal measurement systems in general and test and measurement instruments in particular. For example, in addition to the waveforms representing the signals currently received at the channel inputs, waveforms referred to as function waveforms may also be displayed. Function waveforms are waveforms created by processing the signal waveforms such as performing arithmetic manipulations or combining multiple input signal waveforms in some predetermined manner. The resulting waveforms are placed in a display memory for subsequent retrieval and display. In addition, memory waveforms may also be displayed. Memory waveforms are waveforms which have been stored in memory for some predetermined time for later display. In addition to the above waveforms, other display elements such as marker indicators, trigger indicators, etc. are typically displayed.

Conventional test and measurement systems typically provide a display grid on which the display elements are presented. The display grid divides the coordinate axes into a series of divisions. Waveforms arc displayed on the display grid and arc scaled vertically and horizontally to facilitate analysis. Typically, the horizontal scale represents sweep speed and is in units of seconds per division. The vertical scale represents signal amplitude and is in volts per division. The center of the horizontal axis represents the delay or horizontal position of the displayed waveform and is referred herein to as horizontal offset. The center of the vertical axis represents the voltage offset of the displayed waveform and is referred to as vertical offset. The adjustment of these parameters is generally referred to signal scaling or waveform scaling and the above parameters are referred to as scaling parameters. Thus there are four scaling parameters which are controlled by the user to capture a desired portion of a waveform and to achieve a desired relative display of multiple waveforms: horizontal scale, horizontal offset, vertical scale and vertical offset.

Conventional test and measurement systems typically have one or more dials or knobs to control waveform scaling. Some conventional systems provide four knobs, one for each scaling parameter, for each input channel in the instrument. In test and measurement systems which have a single time base generator, there are often vertical scale and offset knobs dedicated to each channel and a single common knob dedicated to horizontal scale and offset. In other types of conventional test and measurement systems there is just one set of knobs for vertical scale and offset control. In this type of system, the user must first select which waveform is to be modified in accordance with the knob adjustments. Other conventional signal scaling systems have a single general purpose knob that requires the user to assign to the knob both, the scaling parameter to be changed and the waveform to be modified. The assignment of scaling parameters and/or waveforms to a knob may be achieved through activation of hardware and software switches.

There are a number of drawbacks to these conventional systems. First, there are numerous control actions required to assign parameters and waveforms to individual knobs and numerous adjustments that have to be made to achieve a desired scaling. This yields a complicated user interface that is difficult to learn and operate. In addition, these scaling parameters are adjusted independently; the user can typically modify only a single scaling parameter of a single waveform at a given time. As a result, complete scaling operations require a minimum of several control operations. In addition, it is not uncommon to return to a particular scaling parameter/waveform to make further modifications after other scaling parameters have been modified. Thus, because multiple controls are involved, these manipulations can be iterative in nature, further complicating the use of the instrument. In addition, such iterative control operations often take considerable time, reducing the utilization of the instrument for signal analysis and measurement.

Furthermore, the relationship between the numeric values associated with the scaling control operation and the resulting effect on the displayed waveform is unclear. Users often cannot anticipate the extent to which a waveform will change in size and/or position in response to a specific change in a numeric value.

What is needed, therefore, is a simple, uncomplicated means for enabling a user to perform scaling operations on displayed waveforms quickly and easily without having to perform a large number of control steps and operations and which enables the user to anticipate the resulting effect on the displayed waveforms.

SUMMARY OF THE INVENTION

The present invention is a signal scaling system and methodology for use in a signal measurement system having a graphical user interface which controls a waveform display region on a display device. In one aspect of the invention the signal scaling system is configured to determine one or more displayed waveform scaling parameters to cause portions of selected displayed waveforms appearing within the rescaling rectangle to occupy a predetermined portion of the waveform display region other than the resealing rectangle. For each of the selected displayed waveforms, the scaling parameters include horizontal scaling, horizontal offset, vertical scaling and vertical offset. Preferably, the predetermined portion of the waveform display region comprises the entire waveform display region and the selected displayed waveforms include all waveforms at least partially within the resealing rectangle. The displayed waveforms may include signal waveforms, function waveforms, and memory waveforms and the signal measurement system is preferably a digital oscilloscope.

In one embodiment the signal scaling system includes a resealing rectangle specification unit configured to outline a resealing rectangle on the waveform display region between a user-specified start point and a user-specified end point. The start and end points are at opposing corners of the resealing rectangle. The signal scaling system also includes a scaling computation unit configured to calculate the displayed waveform scaling parameters. This determination is based upon specifications of the resealing rectangle generated by the resealing rectangle specification unit and current scaling parameters generated by the signal measurement system. In one embodiment, the start point is a pixel location of a current cursor position upon receipt of a first selection indication from the signal measurement system. Likewise, the end point is a pixel location of a current cursor position upon receipt of a second selection indication from the signal measurement system. Typically, the user selects a pixel location through the use of one or more well-known pointing devices. Preferably, the scaling computation module determines the scaling parameters in response to a user action.

In another embodiment of the invention the resealing rectangle specification module includes a validation means for determining whether a valid pixel location has been selected as the start and end points. The validation determination is based upon cursor information provided by the signal measurement system. Valid pixel locations are considered to be pixel locations between which the resealing rectangle may be drawn. Preferably, a valid pixel location of the start point is located in a background region of the waveform display region.

In another embodiment of the invention, the validation means includes an interfacing means for interfacing with the signal measurement system to obtain the cursor information. The cursor information includes a current cursor position on the waveform display region and a selection indication of when the user has selected a pixel location on the waveform display region. The validation means also includes a hit-test means for determining whether the selected start point is sufficiently far from a display element to be considered to be within the background region of the waveform display region.

It is noted that the displayed waveform scaling parameters define a resealed representation of the portions of the selected displayed waveforms while the resealing rectangle is drawn over an original representation of the displayed waveforms. In one embodiment the scaling computation unit includes means for alternating between the original representation of the displayed elements and the resealed representation of the portions of the selected displayed waveforms.

In another aspect of the invention, a signal measurement system is disclosed. The signal measurement system includes a display; a graphical user interface for controlling the display to provide a waveform display region; and a signal scaling system configured to determine one or more displayed waveform scaling parameters to cause portions of selected displayed waveforms appearing within the resealing rectangle to occupy a predetermined portion of the waveform display region. In one embodiment the rescaling rectangle is of a predetermined size optionally appearing in a predetermined location of the waveform display region. The displayed waveforms may include signal waveforms, function waveforms, and memory waveforms.

In another embodiment, the signal measurement system includes an resealing rectangle specification unit configured to outline a rescaling rectangle on the waveform display region between user-specified start and end points, which are at opposing corners of the resealing rectangle. In another embodiment, the signal measurement system also includes a scaling computation unit. The scaling computation unit is configured to calculate the displayed waveform scaling parameters based upon specifications of the resealing rectangle generated by the rescaling rectangle specification unit and current scaling parameters generated by the signal measurement system. The start point is preferably a pixel location of a current cursor position upon receipt of a first selection indication from the signal measurement system while the end point is a pixel location of a current cursor position upon receipt of a second selection indication from the signal measurement system.

The signal measurement system also includes an interfacing means for interfacing with the signal measurement system to obtain the cursor information, the cursor information including a current cursor position on the waveform display region and the selection indication of when the user has selected a pixel location on the waveform display region. A hit-test means determines whether the selected start point is sufficiently far from a display element to be considered to be within the background region of the waveform-display region.

Preferably, the predetermined portion of the waveform display region comprises the entire waveform display region. Alternatively, the predetermined portion of the waveform display region comprises a larger or smaller region of the waveform display region, the larger region being user-specified. The displayed waveform scaling parameters define a resealed representation of the portions of the selected displayed waveforms. On the other hand, the rescaling rectangle is drawn over an original representation of the displayed waveforms. In one embodiment, the scaling computation unit includes means for alternating between the original representation of the displayed elements and the rescaled representation of the portions of the selected displayed waveforms.

In another aspect of the invention, a digital oscilloscope is disclosed. The digital oscilloscope includes a display and a graphical user interface for controlling said display to provide a waveform display region. The oscilloscope also includes a signal scaling system configured to determine horizontal and vertical scaling and offset scaling parameters to cause portions of displayed waveforms appearing within a user-created resealing rectangle to occupy the entire waveform display region. The signal scaling system includes an resealing rectangle specification unit configured to outline the resealing rectangle on the waveform display region between a user-specified start point in a background region of the waveform display region and a user-specified end point. The signal scaling system also includes a scaling computation unit configured to calculate the scaling parameters based upon specifications of the resealing rectangle generated by the rescaling rectangle specification unit and current scaling parameters generated by the digital oscilloscope. The signal scaling system further includes means for alternating between an original representation of the displayed elements and a rescaled representation of the displayed waveforms.

In another aspect of the invention, a method for scaling waveforms in a signal measuring system having a display device and a graphical user interface that controls a waveform display region on the display device is disclosed. The method includes the steps of: (a) generating an rescaling rectangle between a user-specified start pixel location and a user-specified end pixel location such that the start and end points are opposing corners of the rescaling rectangle; (b) calculating new scaling parameters in accordance with the resealing rectangle for displayed waveforms within the rescaling rectangle; and (c) drawing a new waveform display region such that the resealing rectangle occupies a predetermined larger portion of the waveform display region.

In one embodiment, the step (a) comprises the steps of: (1) detecting a user selection of a pixel location in a background region of the waveform display region; (2) tracking the cursor until selection of the end point is detected; and (3) drawing the resealing rectangle between the start and end points. In another embodiment, the step (b) comprises the step of: (1) calculating new scaling parameters in accordance with the rescaling rectangle for displayed waveforms within the resealing rectangle based upon horizontal and vertical coordinate values for coordinates of the resealing rectangle and a current vertical and horizontal scaling of the displayed waveforms.

In still another embodiment, the method further includes the steps of: (d) providing a first toggle means of returning to an original scaling; (e) returning to the original representation of said display elements when the first toggle means is selected by the user; (f) providing a second toggle means of returning to the resealed representation of said display elements; and (g) returning to the rescaled representation of the display elements when said second toggle means is activated by the user.

Further features and advantages of the present invention as well as the structure and operation of various embodiments of the present invention are described in detail below with reference to the accompanying drawings. In the drawings, like reference numbers indicate identical or functionally similar elements. Additionally, the left-most one or two digits of a reference number identifies the drawing in which the reference number first appears.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 4 is a flowchart of one embodiment of the signal scaling method of the present invention performed by the present invention when implemented in the digital oscilloscope illustrated in FIG. 1;

DETAILED DESCRIPTION

Figure 1:
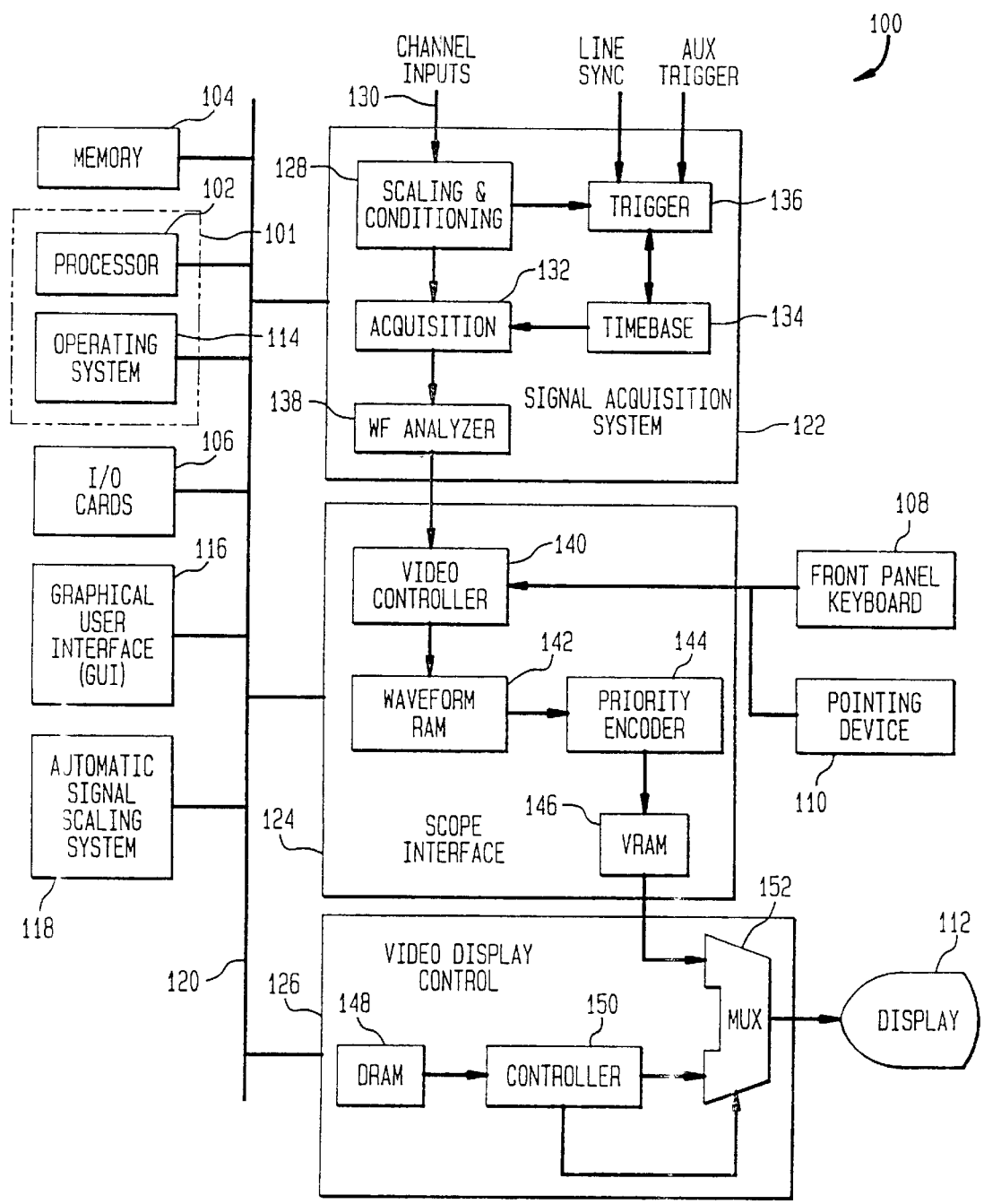
FIG. 1 is a functional block diagram of a digital oscilloscope suitable for implementing the signal scaling system and method of the present invention.

The present invention is a signal scaling system and method that may be implemented in any signal measurement system having a graphical user interface controlling a waveform display. In one preferred embodiment of the present invention, the signal scaling system is implemented in a test and measurement instrument, such as a digital or analog oscilloscope, logic analyzer, network analyzer, spectrum analyzer or waveform generator. FIG. 1 is a functional block diagram of an exemplary digital oscilloscope suitable for implementing the signal scaling system and method of the present invention.

The digital oscilloscope 100 is a commonly-available digital oscilloscope designed to acquire, analyze and display a wide variety of signals gent rally in terms of the voltage of the signals versus time. The digital oscilloscope 100 preferably includes a general purpose computer system, which is programmable using a high level computer programming language, and specially programmed, special purpose hardware for performing signal acquisition, analyze and display functions.

The digital oscilloscope 100 includes a processor 102, a memory unit 104, input/output (I/O) interface cards 106, storage units (not shown) such as a hard disk drive and a floppy disk drive, one or more input devices such as front keyboard panel 108 and pointing devices 110 and display 112. The memory 104 is used for storage of program instructions and for storage of results of calculations performed by the processor 102. In a preferred embodiment, the memory 104 includes random access memory (RAM). The display is preferably a liquid crystal display and is logically or physically divided into an array of picture elements (pixels). The input/output (I/O) interface cards 106 may be modem cards, network interface cards, sound cards, etc.

The processor 102 is typically a commercially available processor, such as the PENTIUM microprocessor from INTEL Corporation, POWERPC microprocessor, SPARC processor, PA-RISC processor or 68000 series microprocessor. Many other processors are also available. Such a processor usually executes a program referred to as an operating system 114, such as the various versions of the WINDOWS operating systems from MICROSOFT Corporation, the NETWARE operating system available from NOVELL, Inc., or the UNIX operating system available from many vendors such as SUN MICROSYSTEMS, Inc., HEWLETT-PACKARD and AT&T. The operating system 114 controls the execution of other computer programs such as a graphical user interface (GUI) 116 and the signal scaling system 118, and provides scheduling, input-output control, file and data management, memory management, and communication control and related services. The processor 102 and operating system 114 define a computer platform shown by dashes block 101, for which application programs in high level programming languages are written. The functional elements of the digital oscilloscope 100 communicate with each other via bus 120.

The digital oscilloscope 100 includes a signal acquisition system 122, a scope interface 124 and video control 126.

The signal acquisition system 122 includes scaling and conditioning 128 that receives input signals through channel inputs 130. The scaling and conditioning unit 128 and acquisition unit 132 include well-known high frequency electronics for signal acquisition, signal conditioning, and analog-to-digital conversion, all of which are controlled by the computer system 101 and are considered to be well-known in the art. The timebase 134 drives the analog-to-digital conversion process performed in acquisition 132, specifying when to sample the input signals and how many samples are to be taken. The trigger 136 synchronizes the acquisition process through the timebase 134, enabling the user to arrange a trigger event to obtain a stable waveform display of the desired features of one or more of the input signals. Trigger 136 may be based upon a line sync or auxilliary trigger input, as is well known in the art.

The waveform analyzer 138 performs measurement processes for developing the waveform for display. It contains hardware and software to perform well-known operations such as setting the analog-to-digital codes for the acquisition unit 132 and mapping the resulting digital information to the physical pixel locations which are ultimately presented on display 112 under the control of GUI 116. The pointing device 110 and/or the keyboard 108 are used to move a cursor on the GUI-controlled display 112 to select display elements under the cursor. The pointing devices 10 may include any number of pointing devices such as a mouse, trackball or joy stick. Of course, the cursor may be controlled with one or more keyboards 108 located externally or integrated into a front panel of the digital oscilloscope 100.

The scope interface card 124 includes a video controller 140 that controls the rendering of pixels into the waveform random access memory (RAM) 142. It also receives display element control commands and cursor input information from the front panel keyboard 108 and the pointing device(s) 110. The waveform RAM 142 includes a data structure for each pixel location on the display 112. The data structures contain information regarding every display element that is to be drawn at each pixel location. Although there may be multiple display elements which are to be drawn at a given pixel location, only one color may be rendered at that location. The waveform RAM 142 supplies the priority encoder 144 with this information. The priority encoder 144 prioritizes the competing display elements. For example, if the user arranged a marker and a waveform such that they are located in the same pixel location, then the priority encoder 144 selects that display element with a highest predetermined priority. In such an example, the color of the marker is rendered at the pixel location providing a display that appears to show the marker over the waveform. The priority encoder then sends the selected color to the VRAM 146 which then causes the pixel to be rendered in the indicated color.

The video display controller 126 includes a dynamic random access memory (DRAM) 148 which contains data specifying a color for each pixel in the display 112. Likewise, the video random access memory (VRAM) 146 also contains data specifying a color for each pixel in the display 112. The computer system 101 controls the information in DRAM 148 while the signal acquisition system 122 controls information in the VRAM 146. For each pixel in the display 112, the video controller 126 selects whether the pixel in the display 112 is specified from VRAM 146 or DRAM 148. In general, information in VRAM 146 includes digitized waveforms being generated by the system 122 with high rates of change that are much too fast for software processing by the computer system 101 for real-time display of the waveforms on display 112.

Video controller 126 includes a controller 150 and a multiplexer 152. Controller 150 controls which of the two inputs to the multiplexer 152 are processed into display signals for transmission to the display 112 under the control of the graphical user interface 116. The controller 150 typically monitors color data sent from the DRAM 148 and may be programmed to switch the multiplexer 152 to a different input when a particular programmed color is received from the DRAM 148. A rectangular pixel area is typically defined within DRAM 148 with the programmed color, typically dark gray. The programmed color is not displayed, but instead serves as a data path switch control for the multiplexer 152. Therefore, within the programmed color rectangle, display data comes from VRAM 146. When various control functions are needed, an interactive dialog box is drawn within the programmed color rectangle.

The signal scaling system 118 implements a simple and intuitive method for resealing waveform and other display elements presented on the display 112 under the control of the GUI 116. The signal scaling system 118 determines one or more displayed waveform scaling parameters to cause portions of selected displayed waveforms appearing within a resealing rectangle to occupy a predetermined portion of the waveform display region other than the rescaling rectangle. The software routines for performing the signal-scaling methodology in accordance with the invention typically reside in memory 104 and/or disk storage devices, and may be stored on a computer-readable medium such as, for example, magnetic disk, compact disc or magnetic tape and may be loaded into the digital oscilloscope 100 using an appropriate peripheral device as known in the art.

Preferably, the signal scaling system 118 is implemented in any well-known programming language such as C or C++. Those skilled in the art will appreciate that different implementations, including different function names programming languages, data structures, and/or algorithms may also be used in embodiments of the present invention other than those described below. It should be further understood that the invention is not limited to a particular computer platform, particular operating system, particular processor, or particular high level programming language, and that the hardware components identified above are given by way of example only. The signal scaling system may be implemented, for example, in dedicated hardware, firmware, or any combination thereof.

Figure 2:
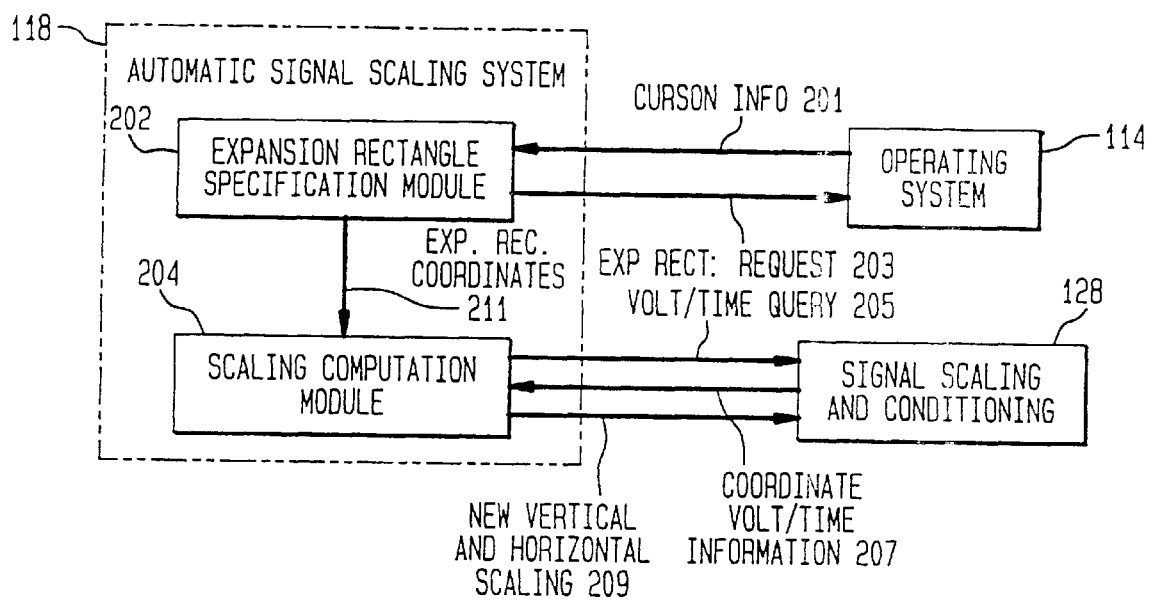
FIG. 2 is a functional block diagram of one embodiment of the signal scaling system implemented in the digital oscilloscope illustrated in FIG. 1.

A preferred implementation of the present invention is in test and measurement equipment having a graphical user interface 120, such as the digital oscilloscope 100. A functional block diagram of one preferred embodiment of the signal scaling system 118 of the present invention implemented in the digital oscilloscope 100 is shown in FIG. 2. The function and operation of the signal scaling system 118 will be described with reference to an exemplary waveform scaling operation illustrated in FIGS. 3A and 3B.

Figure 3A:
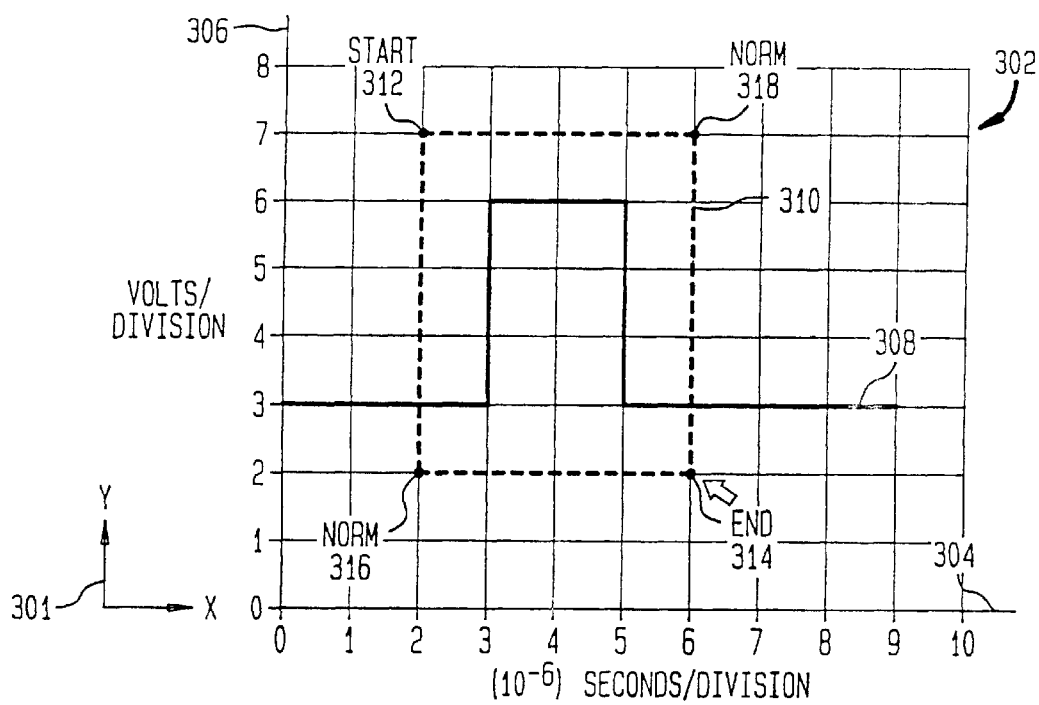
FIG. 3A is a diagram illustrating an exemplary waveform display region showing an rescaling rectangle created by the user in accordance with the signal scaling system of the present invention and a single exemplary waveform.
Figure 3B:
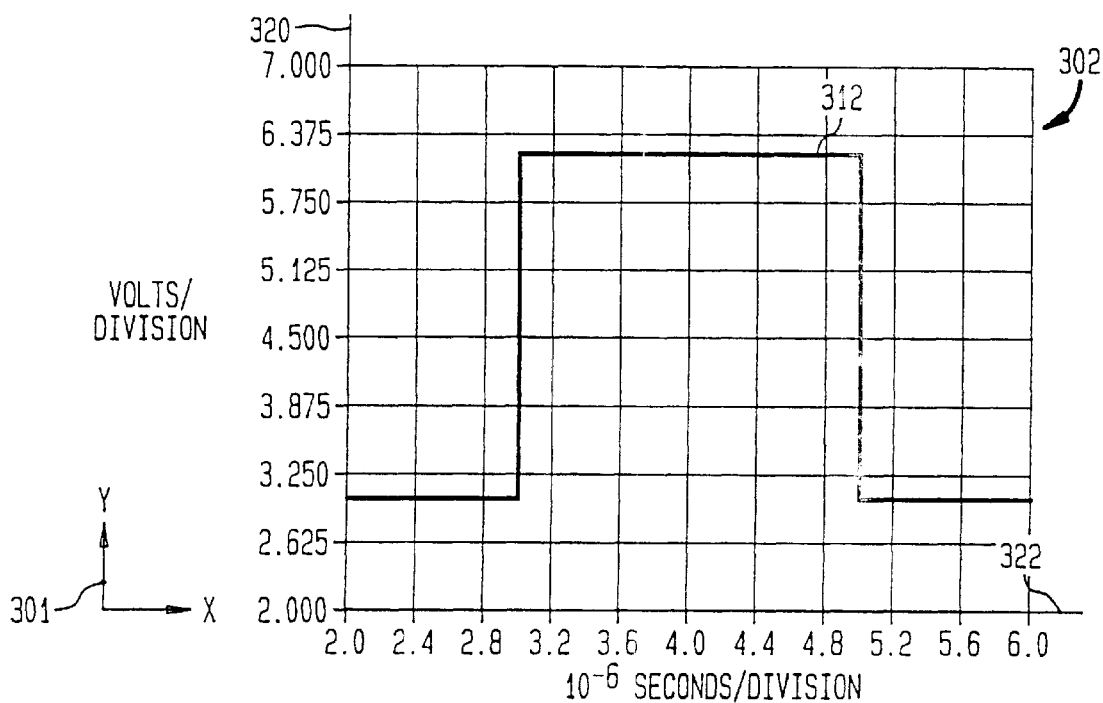
FIG. 3B is a diagram illustrating an exemplary waveform display region resealed in accordance with the rescaling rectangle illustrated in FIG. 3A.

As shown in FIG. 3A, a waveform display region 302 is divided into ten divisions along the horizontal axis 304 and eight divisions along the vertical axis 306. The horizontal axis 304 represents the sweep speed and is provided in units of microseconds per division. The horizontal scale is 1 microsecond per division and the horizontal extent is 10 microseconds. The horizontal coordinate axis extends from 0 through 10 microseconds and the horizontal offset is at 5 microseconds. The vertical axis 306 represents signal amplitude and is in units of volts per division. The vertical scale is 1 volt per division and the vertical extent is 8 volts. The vertical coordinate axis extends from 0 through 8 volts and the vertical offset is at 4 volts. A single pulse waveform 308 is shown on the waveform display region 302. The signal pulse 308 rises from 3 to 6 volts at 3 microseconds and returns to 3 volts at 5 microseconds. In FIG. 3A the waveform 308 is presented in the original scaling while in FIG. 3B is the same waveform shown resealed, referred to as resealed waveform 312.

The signal scaling system 118 includes a resealing rectangle specification unit 202 that is responsive to a user-controlled cursor position. The rescaling rectangle specification unit 202 is configured to outline a rectangular region 310 of the waveform display region 302. In addition, the signal scaling system 118 includes a scaling computation module 204 configured to rescale all relevant display elements in accordance with scaling parameters defined by the rectangular region 310. This results in the portion of the display elements contained within the rectangular region 310 occupying a predetermined portion of the waveform display region 302.

The resealing rectangle specification module 202 includes an interface with the digital oscilloscope 100 to obtain cursor information 201. As noted, the digital oscilloscope 100 is preferably a computer-based system containing computer system 101. Typically, in such embodiments, display control and status information such as cursor information 201 is obtained from the operating system 114 running on the processor 102 through the generation of well-known procedure calls.

The cursor information 201 includes a current position of the cursor on the waveform display region 302 and an indication of when the user has selected a pixel location on the waveform display region. The user may select a pixel location through well-known pointing devices introduced above, such as a mouse, trackball, track-pad, joy stick, keyboard, etc. The module 202 determines whether a pixel location has been selected by the user based upon these inputs in a well-known manner. Preferably, the module 202 provides these inputs to a hit-test system as described in commonly owned U.S. patent application Ser. No. 08/863,461 entitled "System and Method For Efficient Hit-Testing in a Graphical User Interface," naming as an inventor Jay A. Alexander and filed concurrently herewith, the specification of which is hereby incorporated by reference in its entirety. The preferred hit-test system determines whether the user has selected a cursor position that is sufficiently close to a display element to be considered a selection by the user of that display element or a selection of a background region of the waveform display region. It is understood, however, that the module 202 may include or interface with other means for determining whether a pixel location has been selected by the user based upon the above and/or other inputs and using other techniques now or later developed.

When the user has selected the background region on the waveform display region 302, the module 202 identifies the selected pixel location as a start point 312 from which the rescaling rectangle 310 will be drawn. The module 202 then calculates the rescaling rectangle 310 using the starting point 312 and the current cursor position as opposing coordinates of the rectangle 310. The resealing rectangle specification module 202 continually tracks the current cursor position as the cursor is dragged across the waveform display region by the user.

The resealing rectangle specification module 202 periodically draws the resealing rectangle 310 on the waveform display region 302 as the current cursor position is changed by the user until an end point 314 is reached. The module 202 periodically generates an rescaling rectangle request 203 that is provided to the operating system 114 to draw the resealing rectangle 310 on the waveform display region 302. The generation of such a procedure call is considered to be well-known in the art. This call preferably specifies a particular color and line configuration, such as dashes, which clearly distinguishes the rescaling rectangle 310 from the displayed waveforms and other display elements.

The resealing rectangle request 203 is preferably a standardized procedure call containing two coordinates which specify the resealing rectangle 310 to the operating system 114. In the exemplary implementation of the digital oscilloscope 100, these coordinates are $(X_{left}, Y_{bottom})$ and $(X_{right}, Y_{top})$ wherein $X_{right}$ is always greater than $X_{left}$, and $Y_{top}$ is always greater than $Y_{bottom}$. In order to enable the user to select any pixel location as the start point 312 and drag the cursor in any desired direction to create the resealing rectangle 310, the system 118 "normalizes" the resealing rectangle 310 to the coordinate system 301 adopted by the graphical user interface 116. This normalization converts the starting and ending points so that the above-noted relationship is satisfied.

Referring to FIG. 3A, there are four scenarios regarding the manner in which the user creates the rescaling rectangle 310. From a start point 312, the user may drag the cursor through any one of the four quadrants surrounding the start point 312. Since the start point 312 and the end point 314 have at least one coordinate value in common with normalized points 316 and 318, the normalized points are easily determined. In the example illustrated in FIG. 3A the user-selected start and end points 312 and 314 are different than the normalized points 316 and 318, requiring a conversion to be performed. However, if the start and end points 312 and 314 are such that $X_{right}$ is greater than $X_{left}$ and $Y_{top}$ is greater than $Y_{bottom}$, then they coincide with the normalized points 316 and 318 and no conversion or normalization is necessary.

During the creation of the rescaling rectangle 310, the displayed waveforms and other display elements will continue to be presented in the original scaling as shown in FIG. 3A. When the user completes creating the rescaling rectangle 310, the system 118 waits until the user either activates or deselects the scaling operations of the present invention. The user preferably invokes waveform scaling through the selection of an arbitrary point within the resealing rectangle 312. In alternative embodiments, a particular key stroke or menu item may be provided as a means for the user to communicate this selection or the selection may occur automatically after the creation of the rescaling rectangle 310. Likewise, the user deselects waveform scaling preferably though the selection of an arbitrary point outside of the resealing rectangle 310. In another preferred embodiment, the user may also deselect the scaling operations of the present invention by not performing any actions for a predetermined period of time. In this embodiment, such inactivity will cause the waveform scaling operations of the present invention to time-out. When waveform scaling operations are positively or passively deselected, the resealing rectangle 310 is no longer presented on the waveform display region 302, returning the implementing signal measurement system to a prior operational state.

As noted, the scaling computation module 204 rescales all relevant display elements in accordance with scaling parameters defined by the user-created rectangular region 310. That is, the selection of the resealing rectangle 310 identifies the region of the waveform display region 302 which the user desires to rescale so that the display elements contained within the resealing rectangle 310 occupy the entire waveform display region 302.

The scaling computation module 204 receives the resealing rectangle coordinates 211 from the module 202 and determines the new scaling parameters for the displayed waveforms in accordance with the rescaling rectangle 210 based upon the scaling information received from the signal scaling and conditioning unit 128. The scaling computation module 204 preferably determines the new scaling parameters in response to a user command or other action. This may be achieved through any well-known means, such as selecting an arbitrary point within the rescaling rectangle 310. Alternatively, the scaling computation module 204 may determine the new scaling parameters without the user performing any function or additional step at all beyond the creation of the resealing rectangle 310.

The received scaling information is obtained by generating a volt/time query 205 for the signal scaling and conditioning unit 128. The query requests the current vertical and horizontal scaling and the voltage and time associated with the normalized resealing rectangle coordinates 316 and 318 for each displayed waveform. The signal scaling and conditioning unit 128 returns coordinate voltage/time information 207 to the scaling computation module 204. The calculations performed by the signal scaling system 118 of the present invention are described with reference to the exemplary resealing operation of the single exemplary waveform depicted in FIGS. 3A and 3B.

The new vertical scale 320 illustrated in FIG. 3B has a vertical scaling of 625 millivolts and ranges from 2.0 volts to 7.0 volts with a vertical offset of 4.5 volts. Referring to FIG. 3A, this scaling represents the resealing rectangle 310 which extends from 2 volts through 7 volts along the vertical scale 306. Since the extent of the new vertical scale 320 is 5 volts and it is divided into 8 divisions, then each division is 625 millivolts. This is shown by:

$$V_{scale} = \frac{(7 \text{ div.} - 2 \text{ div.})(1 \text{ volt/div.})}{8 \text{ div.}} = 625 \text{ millivolts/div.}$$

$$V_{offset} = \frac{(7 \text{ div.} + 2 \text{ div.})(1 \text{ volt/div.})}{2} = 4.5 \text{ volts}$$

The horizontal coordinate axis 314 illustrated in FIG. 3B has a horizontal scaling of 400 nanoseconds per division and a horizontal offset of 4 microseconds. Referring to FIG. 3A, this scaling represents the resealing rectangle 310 which extends from 2 microseconds through 6 microseconds along the horizontal scale 304. Since the extent of the new horizontal scale 322 is 4 microseconds and it is divided into 10 divisions, then each division represents 400 nanoseconds. These values are calculated by the signal scaling system 118 as shown below.

$$H_{scale} = \frac{(6 \text{ div} - 2 \text{ div})(1 \text{ } \mu\text{sec/div})}{10 \text{ div.}} = 400 \text{ nanoseconds/div.}$$

$$H_{offset} = \frac{(6 \text{ div} + 2 \text{ div})(1 \text{ } \mu\text{sec/div})}{2} = 4 \text{ microseconds}$$

It should be understood that the resealed pulse signal 312 exhibits the same amplitude and timing attributes as before the resealing operation is performed. However, the contents of the resealing rectangle 310 completely occupies the waveform display region 302 shown in FIG. 3B. The contents of the resealing rectangle 310 completely occupies the waveform display region 302 as shown in FIG. 3B. That is, the portion of the original signal waveform 308 which extends beyond the boundaries of the resealing rectangle 310 are not visible on the waveform display region 302 illustrated in FIG. 3B.

Note that in this illustrative example, only a single waveform is displayed and subsequently resealed in accordance with the present invention. It should be understood, however, that the above calculations are to be performed on every waveform and other display elements currently displayed. For each such waveform different vertical and/or scaling and offset values are required to be calculated in order to achieve the desired resealing as defined by the user through the creation of the rescaling rectangle 310. In systems which have a one timebase generator 134, the signal waveforms all have the same horizontal scaling. In such systems, the horizontal scaling is the same and the new horizontal scaling is preferably determined for just one waveform and utilized for all signal waveforms. On the other hand, because they are stored prior to viewing, the memory and function waveforms have independent horizontal scaling. In such systems, new horizontal scaling must be determined for each displayed waveform. The new scaling information, including vertical and horizontal scaling for each displayed waveform is output to the signal scaling and conditioning unit 128 as shown by new scaling command 209.

The scaling computation module 204 includes means for enabling the user to toggle between the original and new scaling. One preferred approach that utilizes the graphical user interface 116 is to provide a dialog box on the waveform display region providing the user with a graphical means of returning to the original scaling. The dialog box, preferably labeled "undo" will undo the scaling dictated by the resealing rectangle 310 and return the waveforms and display elements to their original scaling. Selection of the dialog box causes the scaling computation module 204 to generate the appropriate calls to the signal scaling and conditioning unit 128 to display the originally-scaled waveforms. Preferably, the waveform display region also contains the resealing rectangle 310 as originally drawn by the user to enable the user to visually correlate the resealed waveforms and display elements to the region enclosed by the resealing rectangle 310 on the original display.

When the user returns to the original scaling, a dialog window entitled "redo" preferably accompanies the resealed display to enable the user to reapply the resealing parameters in accordance with the resealing rectangle 310. Thus, the user may toggle between the original and new scaling through the selection of the undo/redo dialog windows. It is understood that there are many other methods and techniques that may be utilized to provide user-activated functions such as the undo and redo functions described above. These include, for example, selection of menu items, key strokes, voice activation, and through the use of any type of input device now or later developed.

FIG. 4 is a flowchart of one embodiment of the automatic signal scaling process of the present invention. The automatic signal scaling process 400 is started at block 402 when the user selects a pixel location that is in the background region of the waveform display region. The user may make such as election using the pointing device 110, front panel keyboard 108 or any other well-known means. As noted, the selection of the background region is preferably determined by outputting the cursor information 201 received from the operating system 114 to the hit test system incorporated by reference above, although other approaches may be used. Once the user has selected a pixel location in the background region, then at block 404 the signal scaling system 118 generates an resealing rectangle 310 using the selected pixel location as a start point 312 and the current cursor position as an opposing corner of the resealing rectangle 310. The processes performed at block 404 are described in detail below with reference to FIGS. 5A and 5B. Once the user completes the dragging of the cursor across the waveform display region and indicates that the selected region is to be magnified to occupy the complete waveform display region, processing at block 406 is performed.

At block 406, new scaling parameters are calculated in accordance with the selected rescaling, rectangle 310. The new scaling parameters are determined for all displayed waveforms based upon the horizontal and vertical coordinate values for normalized coordinates of the rescaling rectangle and the current vertical and horizontal scaling of the displayed waveforms.

Once the new scaling parameters for each of the displayed waveforms are determined, then the new waveform display region is drawn at block 408. The system 118 generates the new voltage and timing information which is received by the signal scaling and conditioning unit 128 to rescale each of the displayed waveforms in accordance with the expanded rectangle 310. The expanded rectangle 310, including the display elements positioned within the rectangle 310, are magnified to completely occupy the waveform display region 302. The automatic signal scaling process of the present invention then ceases at stop block 410.

Figure 5A:
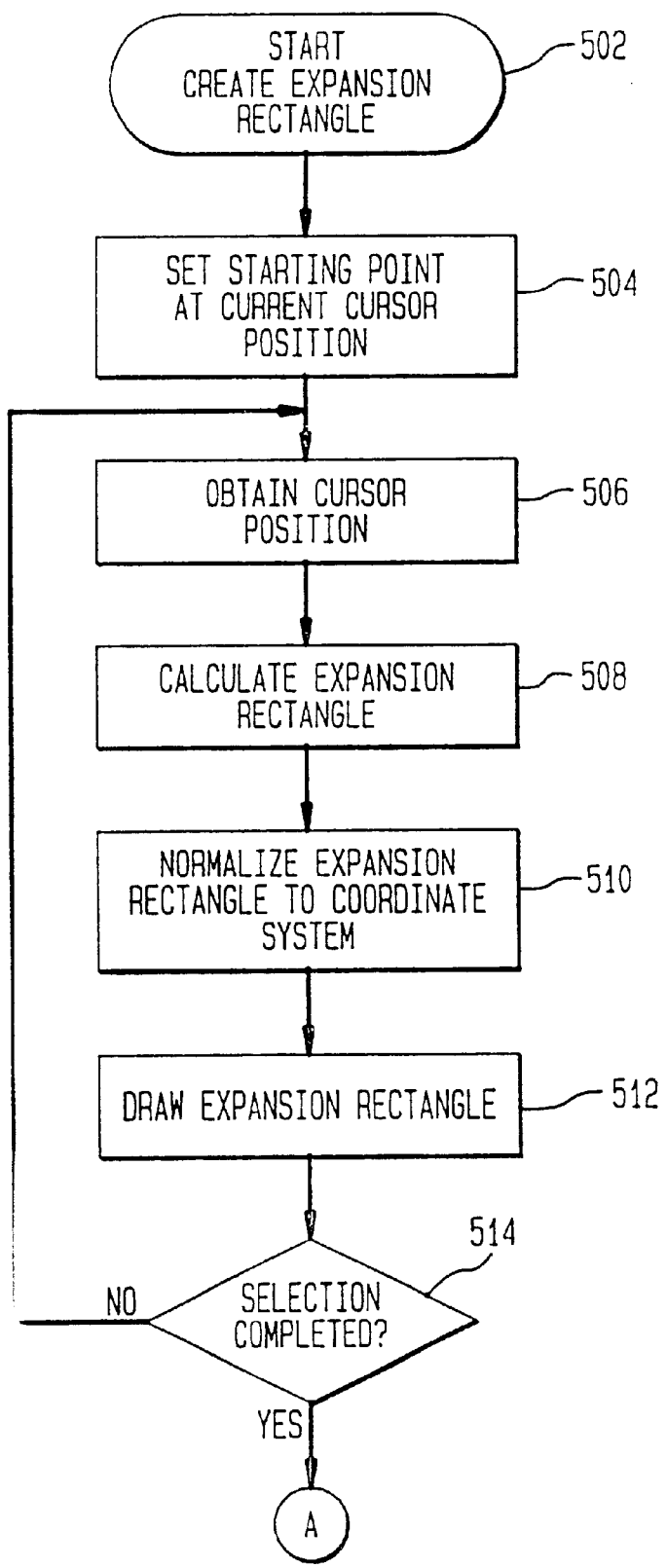
FIG. 5 is a flowchart of one embodiment of the processes performed to create an rescaling rectangle in accordance with the present invention.
Figure 5B:
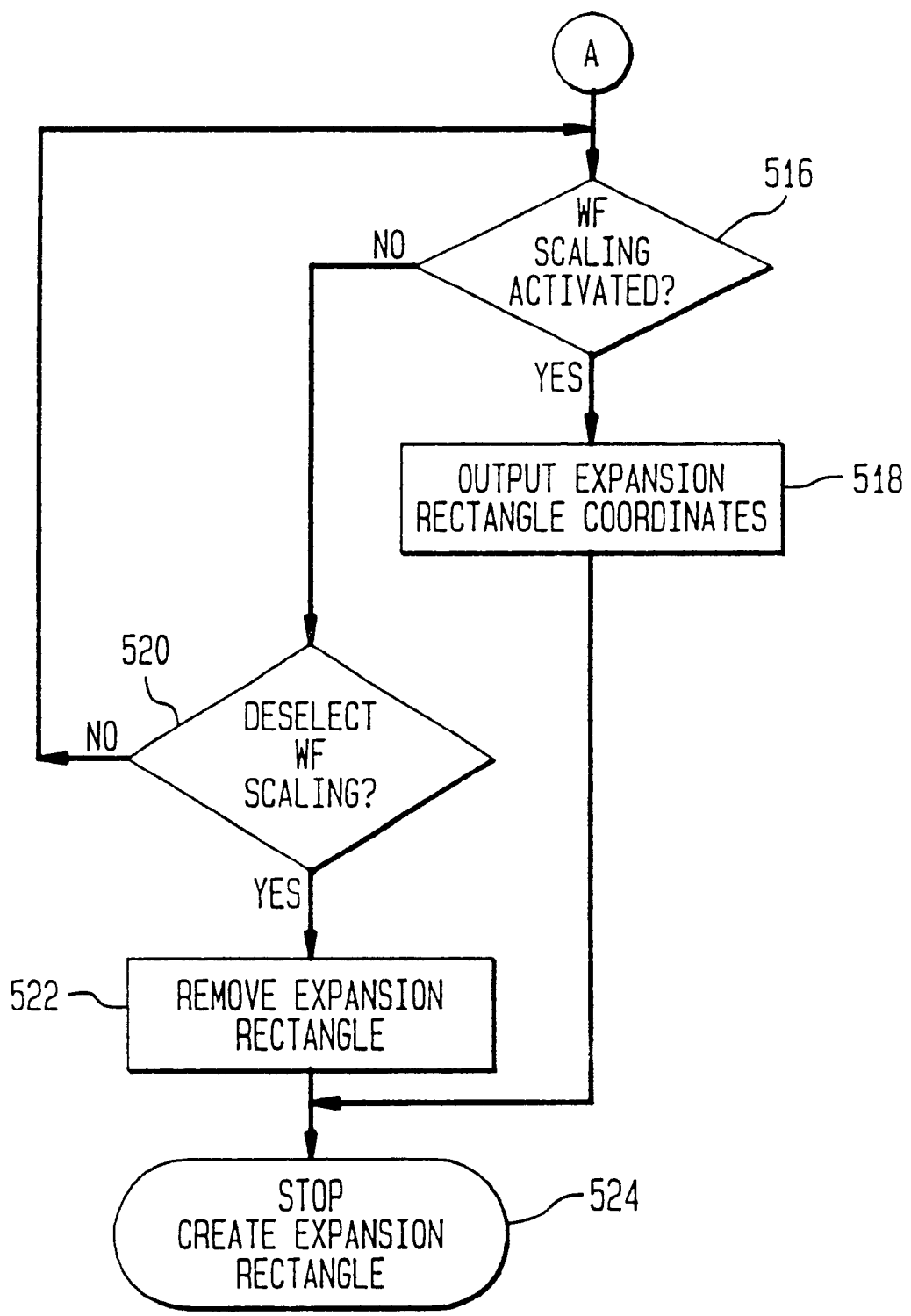

The process performed by the present invention to create the rescaling rectangle 310 described above with reference to block 404 are described in detail hereinbelow with reference to the flowchart shown in FIGS. 5A and 5B. The process 404 is described with reference to the exemplary rescaling rectangle 310 introduced above.

The process 404 begins at start block 502 when the signal scaling operations of the present invention are invoked or activated by the user. As noted, this is preferably through the selection of a pixel location in the background region of the waveform display region 302, although other techniques may be used. After start block 502, the process 404 advances to block 504 whereat the start point 312 of the rescaling rectangle 310 is determined. The start point 312 is determined to be the current cursor position when the cursor information 201 received from the operating system 114 indicates that the user has selected a pixel location in the background region of the waveform display region. Once the start point 312 is determined, the automatic signal scaling system 118 continually tracks the current cursor position at block 506. The system 118 continues to receive the current position for the cursor as it is moved or dragged across the waveform display region by the user.

At block 508, the rescaling rectangle 310 is calculated based upon the current cursor position received at block 506 and the start point 312 determined at block 504. The rescaling rectangle 310 is drawn with the current cursor position and the start point as opposing corners of a rectangle. As noted, the endpoints of the resealing rectangle may need to be converted to a format appropriate for the graphical user interface 116. A normalization process is performed at block 510 as described above, resulting in the two normalized points 316 and 318 which specify the resealing rectangle 310.

The resealing rectangle 310 is drawn at block 512. Here, the signal scaling signal 118 generates an appropriate call to the operating system 114 to draw the resealing rectangle 310. Preferably the resealing rectangle 310 is clearly distinguish Ed from the displayed waveforms and other display elements.

The above process is continued as the cursor is dragged across the waveform display region until an indication that the user has created the desired resealing rectangle is received at block 514. In the embodiment wherein the pointing device 110 is a mouse, this may be when the user has released the mouse button during the dragging of the cursor. Other selection indications appropriate for the implemented pointing device 110 may be used. This data is received as part of the cursor information 201 as noted above.

After the user has selected a rescaling rectangle 310, the rectangle is displayed on the display 112 and the displayed waveforms and other display elements will continue to be presented in the original scaling. This condition will continue until the user either activates the waveform scaling operations of the present invention or deselects the waveform scaling feature. At block 516, the automatic signal scaling system 118 monitors the user's actions to determine if the signal scaling operations are to be invoked. In a preferred embodiment, the user may invoke signal scaling through the selection of an arbitrary point within the rescaling rectangle 312 although alternative methods may be used.

If the waveform scaling operations of the present invention are not invoked at block 516, then at block 520 a determination is made as to whether the user has deselected waveform scaling operations. In a preferred embodiment, the user may deselect waveform scaling simply by selecting a point on the waveform display region that is not contained within the resealing rectangle 310 or, preferably, by performing no operation for a predetermined period of time. Other deselection methods and techniques may be used as is known in the art. If it is determined at block 520 that the user deselects the waveform scaling function of the present invention, then the rescaling rectangle 312 is removed from the waveform display region at block 522 and processing completes at block 524.

If it is determined that the user has proceeded to invoke the waveform scaling operations at block 516, then processing continues at block 518 whereat the normalized coordinates 316 and 318 for the resealing rectangle 310 are provided to the scaling computation module 204. Processing then completes at block 524.

Figure 6A:
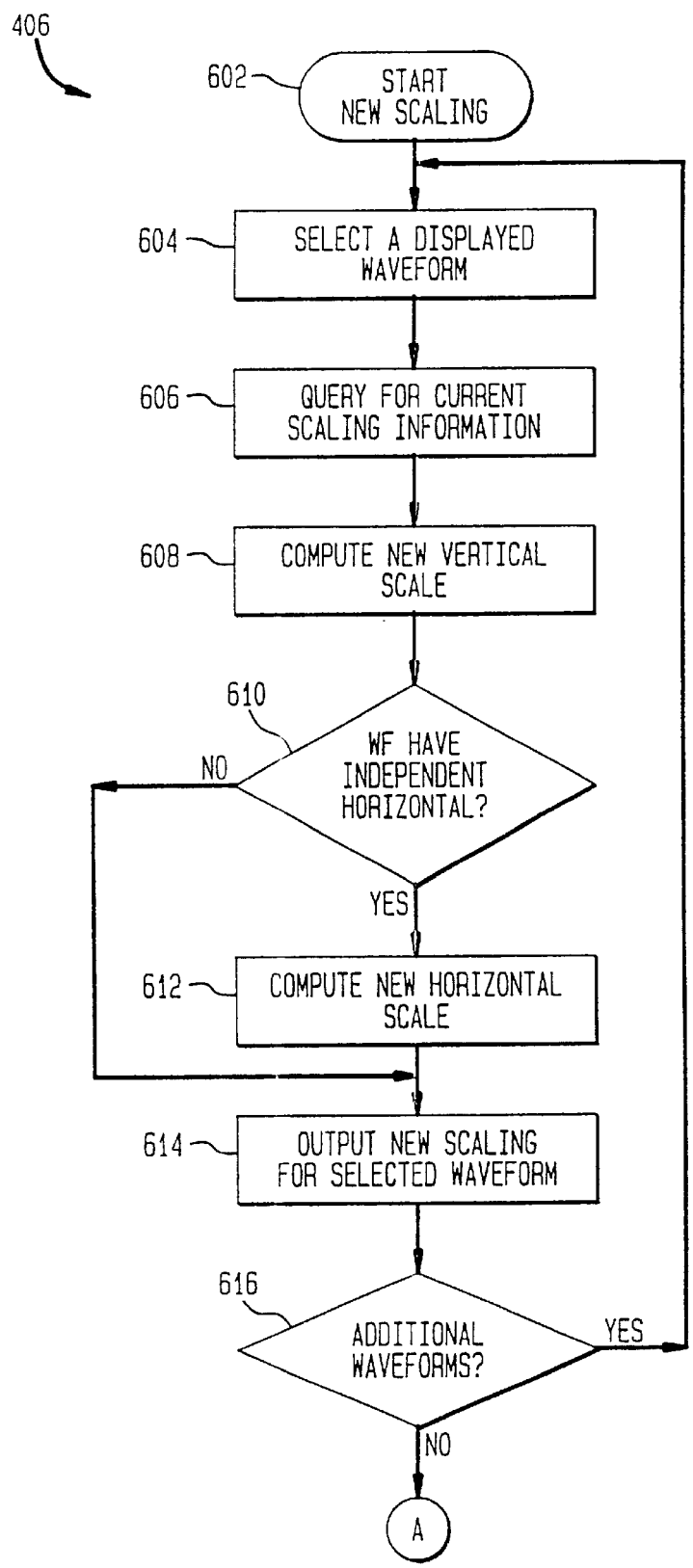
FIG. 6 is a flowchart of one embodiment of the processes performed to rescale displayed waveforms in accordance with a user-created resealing rectangle.
Figure 6B:
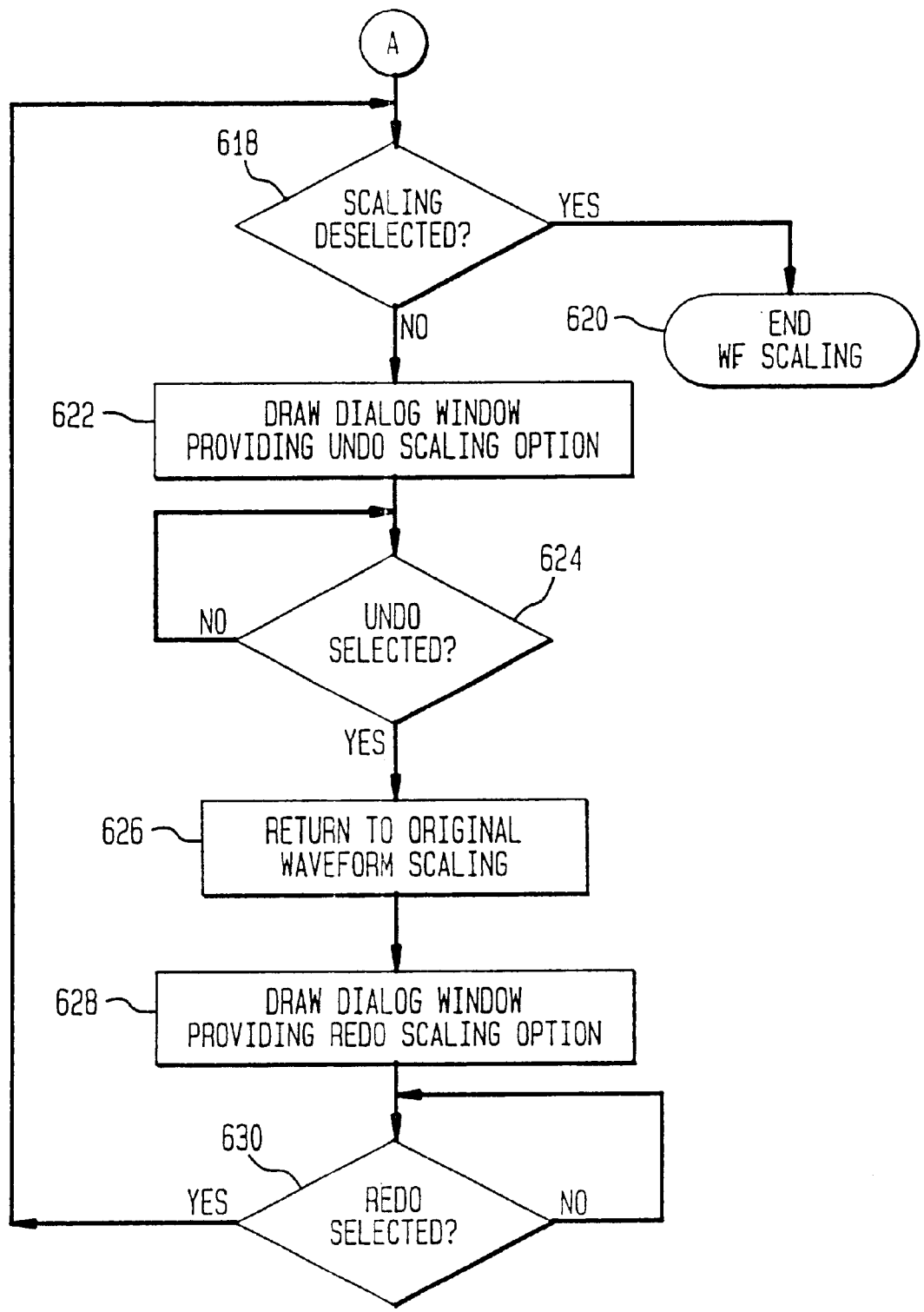

As noted, the process performed by the present invention to determine the new scaling parameters for the displayed waveforms is performed at block 406. This process is described in detail herein below with reference with the flowchart shown in FIGS. 6A and 6B. As with the flowcharts illustrated in FIGS. 4 and 5, the process 406 is described with reference to the exemplary resealing rectangle 310 introduced above.

The new scaling operations are invoked at start block 602 when the user has created the resealing rectangle 310 and has activated the signal scaling operations of the present invention. As noted, this may be achieved through any well-known means, such as selecting an arbitrary point within the resealing rectangle 310 or by performing no function or additional step at all beyond the creation of the resealing rectangle 310. At block 604, the automatic signal scaling system 118 selects a displayed waveform. The signal scaling and conditioning unit 128 is queried for the current scaling information at block 606 and the horizontal and vertical coordinate values associated with the two normalized point 316 and 318 for the selected waveform. The requested information is received and the new vertical scale is calculated at block 608 as described above.

As noted, the horizontal scaling of the waveforms may be linked horizontally due to the common time base in the implementing test and measurement system. Horizontal independence is determined at block 610. If such is the case and the new horizontal scaling has been previously determined, then processing continues at block 614, skipping the block 612 wherein the new horizontal scaling is determined as described above. At block 614, the new scaling information, including vertical and horizontal scaling for the waveform selected at block 604 is output to the signal scaling and conditioning unit 128.

If there are any displayed waveforms remaining to be scaled, as determined at block 616, then the above processes are repeated for each of the remaining waveforms until all waveforms have been resealed. Once all the waveforms have been resealed, then processing continues at block 618 to determine whether waveform scaling of the present invention has been deselected. If so, then processing ceases at block 620.

Otherwise, processing continues at block 622 whereat an "undo" dialog window is drawn on the waveform display region 302 providing the user with a graphical means of returning to the original scaling. The system 118 monitors, at block 624, whether the user selects the dialog box through the appropriate calls to the operating system 114. If it is determined that the user has selected the undo dialog box, then processing continues at block 626.

At block 626 the scaling dictated by the resealing rectangle 310 is replaced by the original scaling and the waveforms and display elements arc returned to their original scaling. This display preferably also contains the rescaling rectangle 310 as originally drawn by the user for reasons noted above.

When the user returns to the original scaling, a dialog; window entitled "redo" preferably accompanies the resealed display to enable the user to reapply the resealing parameters in accordance with the rescaling rectangle 310. This dialog box is drawn at block 628. At block 630 the user's selection of the redo dialog box is monitored. If selected, then processing continues at block 618. Otherwise, the new scaling remains displayed. Thus, the user may toggle between the original and new scaling through the selection of the undo/redo dialog windows, While various embodiments of the present invention have been described above, it should be understood that they have been presented by way of example only, and not limitation. For example, as noted, it is preferable that the resealing rectangle 310 is user-created through the use of a cursor control device. Alternatively, the user may delineate the boundaries of the resealing rectangle using marker indicators or through the use of any other well-known graphical or other means. As noted, it is preferred that the user be given the means to dynamically select the resealing rectangle and determine its size and location, enabling the user to capture the display elements of interest. Alternative embodiments include previously-determined and stored resealing rectangles for retrieval and application to a current waveform display. These predetermined resealing rectangles provide "fixed zooms" that may be about any predetermined portion of the waveform display. In addition, it was noted that in the preferred embodiment the rescaling rectangle is expanded to occupy the entire waveform display region. In alternative embodiments, this will not be the entire waveform display, enabling multiple resealing rectangles to be displayed simultaneously, to allocate portions of the waveform display region to other uses, etc. Thus, the breadth and scope of the present invention should not be limited by any of the above-described exemplary embodiments, but should be defined, only in accordance with the following claims and their equivalents.

What is claimed is:

1. A signal measurement system having a display unit on which an original waveform display region is displayed, the original waveform display region adapted to display a plurality of waveforms in accordance with original scaling parameters, comprising:

a signal scaling system that enables a user to control a size and location of a rescaling rectangle displayed over the original waveform display region and, in response to an external event, displays a rescaled waveform display region with portions of said plurality of waveforms appearing within a perimeter of said rescaling rectangle displayed in accordance with new scaling parameters that are different than said original scaling parameters.

2. The signal measurement system of claim 1,
   wherein said expanded waveform display region and said original waveform display region are displayed concurrently on the display unit.

3. The signal measurement system of claim 1, wherein when said rescaled waveform display region is displayed on the display unit, said rescaling rectangle is not displayed.

4. The signal measurement system of claim 1, wherein said new scaling parameters have values dependent on the size of the rescaling rectangle, said original scaling parameters and a size of said rescaled waveform display region.

5. The signal measurement system of claim 1, wherein said external event comprises an indication that the user completed defining said size and location of said rescaling rectangle.

6. The signal measurement system of claim 1, wherein said external event comprises an indication that the user graphically selected a pixel inside said rescaling rectangle perimeter.

7. The signal measurement system of claim 3, wherein said original and new scaling parameters include horizontal scaling; horizontal position; vertical scaling; and vertical offset.

8. The signal measurement system of claim 1, wherein said rescaling rectangle is defined by a user-specified start point and a user-specified end point on the original waveform display region, said start and end points being at opposing corners of sad rescaling rectangle.

9. The signal measurement system of claim 8, wherein said start point is a pixel location of a current position upon receipt of a first selection indication from the signal measurement system and wherein said end point is a pixel location of a current cursor position upon receipt of a second selection indication from the signal measurement system.

10. The signal measurement system of claim 1, wherein said rescaling rectangle is one of a plurality of predetermined rescaling rectangles, any of which may be selected by the user.

11. The signal measurement system of claim 1, wherein one of either said original or said rescaled waveform display region is displayed on the display unit at any given time, and wherein the user can select which of said waveform display regions is displayed.

12. The signal measurement system of claim 1, wherein said rescaling rectangle is one of a plurality of stored rescaling rectangles, and wherein the user can select one of said rescaling rectangles for display and implementation.

13. A signal measurement system having a display on which a waveform display region is displayed, comprising:

a signal scaling system that determines waveform scaling parameters to cause portions of identified portions of displayed waveforms appearing within a displayed rescaling rectangle to occupy a predetermined portion of the waveform display region.

14. The signal measurement system of claim 13, wherein said rescaling rectangle is of a predetermined size appearing in a predetermined location of said waveform display region.

15. The signal measurement system of claim 13, comprising:

a rescaling rectangle specification unit configured to outline a rescaling rectangle on the waveform display region between a user-specified start point and a user-specified end point, said start and end points being at opposing corners of said rescaling rectangle.

16. The signal measurement system of claim 15, further comprising:

a scaling computation unit configured to calculate said one or more displayed waveform scaling parameters based upon specifications of said rescaling rectangle generated by said rescaling rectangle specification unit and current scaling parameters generated by the signal measurement system.

17. The signal measurement system of claim 13, wherein said predetermined portion of the waveform display region comprises the entire waveform display region.

18. The signal measurement system of claim 15, wherein said start point is a pixel location of a current cursor position upon receipt of a first selection indication from the signal measurement system and wherein said end point is a pixel location of a current cursor position upon receipt of a second selection indication from the signal measurement system.

19. The signal measurement system of claim 15, wherein said rescaling rectangle is one of a plurality of stored rescaling each having an associated set of scaling parameters, and wherein said signal scaling system enables the user to select one of said plurality of rescaling rectangles for displays as said rescaling rectangle.

20. A method for scaling waveforms in a signal measuring system having a display device on which is displayed a waveform display region that displays waveforms in accordance with original scaling parameters, the method comprising the steps of:

(a) storing a plurality of plurality of predetermined sets of scaling parameters in memory;

(b) displaying on the display device a waveform display region with one or more waveforms scaled in accordance with original scaling parameters;

(c) receiving a user selection of one of said plurality of sets of scaling parameters; and (d) displaying on the display device a rescaled waveform display region with predetermined portions of said one or more waveforms scaled in accordance with said selected set of scaling parameters.

* * * * *